United States Patent
Akram

[11] Patent Number: 5,903,058
[45] Date of Patent: *May 11, 1999

[54] CONDUCTIVE BUMPS ON DIE FOR FLIP CHIP APPLICATION

[75] Inventor: Salman Akram, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/841,524

[22] Filed: Apr. 23, 1997

Related U.S. Application Data

[62] Division of application No. 08/682,141, Jul. 17, 1996, Pat. No. 5,736,456.

[51] Int. Cl.⁶ .......................... H01L 23/48; H01L 29/46; H01L 23/58; H01L 21/44
[52] U.S. Cl. ..................... 257/778; 257/777; 257/737; 257/738; 257/774; 257/773; 438/614; 438/959; 438/613
[58] Field of Search ...................... 257/778, 786, 257/784, 787, 737, 738, 734, 690, 691, 722, 775, 774, 773, 758; 438/614, 613, 953

[56] References Cited

U.S. PATENT DOCUMENTS

| | | | |
|---|---|---|---|
| 3,648,131 | 3/1972 | Stuby | 257/774 |
| 4,060,828 | 11/1977 | Satonaka | 257/784 |
| 4,360,142 | 11/1982 | Carpenter et al. | 228/123.1 |
| 4,754,316 | 6/1988 | Reid | 257/777 |
| 4,906,341 | 3/1990 | Yamakawa et al. | 205/123 |
| 5,049,972 | 9/1991 | Uda et al. | 257/737 |
| 5,059,553 | 10/1991 | Berndlmaier et al. | 257/774 |
| 5,095,402 | 3/1992 | Hernandez et al. | 257/724 |
| 5,136,363 | 8/1992 | Endo et al. | 257/737 |
| 5,137,845 | 8/1992 | Lochon et al. | 438/614 |
| 5,217,922 | 6/1993 | Akasaki et al. | 438/125 |
| 5,229,645 | 7/1993 | Nakashima | 252/774 |
| 5,268,072 | 12/1993 | Agarwala et al. | 438/614 |
| 5,293,006 | 3/1994 | Yung | 174/261 |
| 5,317,193 | 5/1994 | Watanabe | 257/774 |
| 5,319,246 | 6/1994 | Nagamine et al. | 257/774 |
| 5,376,584 | 12/1994 | Agarwala | 257/738 |
| 5,381,946 | 1/1995 | Koopman et al. | 228/254 |
| 5,394,013 | 2/1995 | Oku et al. | 257/786 |
| 5,424,245 | 6/1995 | Gurtler et al. | 438/107 |
| 5,449,314 | 9/1995 | Meikle et al. | 438/692 |
| 5,470,787 | 11/1995 | Greer | 438/614 |
| 5,471,092 | 11/1995 | Chan et al. | 257/779 |
| 5,480,835 | 1/1996 | Carney et al. | 257/779 |
| 5,503,286 | 4/1996 | Nye, III et al. | 438/614 |
| 5,625,232 | 4/1997 | Numata et al. | 257/774 |
| 5,677,573 | 10/1997 | Prall et al. | 257/773 |
| 5,731,610 | 3/1998 | Rhodes | 257/773 |
| 5,739,579 | 4/1998 | Chiang et al. | 257/774 |

FOREIGN PATENT DOCUMENTS

| | | | |
|---|---|---|---|
| 63-78555 | 4/1988 | Japan | 257/737 |
| 2-67729 | 3/1990 | Japan | 257/774 |
| 3-250628 | 11/1991 | Japan | 257/737 |
| 6-151355 | 5/1994 | Japan | 257/737 |

*Primary Examiner*—Alexander Oscar Williams
*Attorney, Agent, or Firm*—Trask, Britt & Rossa

[57] ABSTRACT

The present invention relates to an improved method for forming UBM pads and solder bump connections for a flip chip which eliminates at least one mask step required in standard UBM pad forming processes. The method also includes repatterning bond pad locations.

39 Claims, 15 Drawing Sheets

CONDUCTIVE BUMPS ON DIE FOR FLIP CHIP APPLICATION

This is a division of application Ser. No. 08/682,141, filed Jul. 17, 1996, now U.S. Pat. No. 5,736,456, issued Apr. 7, 1998.

BACKGROUND OF THE INVENTION

1. Field of the Invention

The present invention relates to a method for forming conductive bumps on a die for flip chip type attachment to a printed circuit board or the like. In particular, the present invention relates to a method for forming under bump metallization pads, which method eliminates the masking steps required by present industry standard techniques.

2. State of the Art

Definitions

The following terms and acronyms will be used throughout the application and are defined as follows:

BGA—Ball Grid Array: An array of minute solder balls disposed on conductive locations of an active surface of a semiconductor die, wherein the solder balls are refluxed for simultaneous attachment and electrical communication of the semiconductor die to conductors of a printed circuit board or other substrate.

Flip Chip: A chip or die that has a pattern or array of terminations spaced around the active surface of the die for face-down mounting of the die to a substrate.

Flip Chip Attachment: A method of attaching a semiconductor die to a substrate in which the die is inverted so that the connecting conductor pads on the face of the device are set on mirror-image pads of conductive traces carried by the substrate and bonded thereto by solder reflux. Also sometimes known as a C4 attachment ("Controlled Collapse Chip Connection").

SLICC—Slightly Larger than Integrated Circuit Carrier: An array of minute solder balls disposed on an attachment surface of a semiconductor die similar to a BGA, but having a smaller solder ball diameter and pitch than a BGA.

High performance microelectronic devices may comprise a number of flip chips having a BGA or a SLICC, attached to a ceramic or silicon substrate or printed circuit board ("PCB") such as an FR4 board for electrical interconnection to other microelectronic devices. For example, a very large scale integration ("VLSI") chip may be electrically connected to a substrate, printed circuit board, or other next higher level packaging carrier member using solder balls or solder bumps. This connection technology may be referred to generically as "flip chip" or "C4" attachment.

Flip chip attachment requires the formation of contact terminals at flip chip contact sites on the semiconductor die, each site consisting of a metal pad with a lead/tin solder ball formed thereon. Flip chip attachment also requires the formation of solder joinable sites ("pads") on the metal conductors of the PCB or other substrate or carrier which are a mirror-image of the solder ball arrangement on the flip chip. The pads on the substrate are usually surrounded by non-solderable barriers so that when the solder balls of the chip contact sites are aligned with the substrate pads and melt ("reflow"), the surface tension of the liquified solder element supports the semiconductor chip above the substrate. After cooling, the chip is essentially welded face-down by very small, closely spaced, solidified solder column interconnections. An under-fill encapsulant is generally disposed between the semiconductor die and the substrate for environmental protection, and to further enhance the mechanical attachment of the die to the substrate.

FIGS. 1a–1h show a contemporary, prior art method of forming a conductive ball arrangement on a flip chip. First, a plurality of semiconductor elements such as dice including integrated circuitry (not shown) are fabricated on a face surface 12 of a semiconductor wafer 10. A plurality of conductive traces 14 is there formed on the semiconductor wafer face surface 12 positioned to contact circuitry of the respective semiconductor elements (not shown), as shown in FIG. 1a. A passivation film 16 such as at least one layer of $SiO_2$ film, $Si_3N_4$ film, or the like is formed over the semiconductor wafer face surface 12 as well as the conductive traces 14, as shown in FIG. 1b. A first layer of etchant-resistive photoresist film 18 is then applied to a face surface 20 of the passivation film 16. The first photoresist film 18 is then masked, exposed, and stripped to form desired openings (one illustrated) in the first photoresist film 18. The passivation film 16 is then etched through the opening in photoresist film 18 to form a via 22 with either sloped edges or walls 26 or straight (vertical) walls if desired, and which exposes a face surface 24 of the conductive trace 14, as shown in FIG. 1c. Photoresist 18 is then stripped, as shown in FIG. 1d.

FIG. 1e shows metal layers 28, 30, and 32 applied over the passivation film face surface 20 as well as the via 22 to form a multi-layer under bump metallurgy (UBM) 34 by chemical vapor deposition (CVD), plasma-enhanced chemical vapor deposition (PECVD), or physical vapor deposition (PVD) (sputtering or evaporation). The metal layers usually comprise chromium for the first or base adhesion layer 28, chromium-copper alloy for a second, intermediate layer 30, and copper for the third, outer soldering layer 32. Additionally, a fourth metal layer (not shown) of flashed gold is occasionally placed atop the copper third layer 32 to prevent oxidation of the copper. Nickel, palladium and platinum have also been employed as the outer or soldering layer 32. Furthermore, titanium or titanium/tungsten alloys have been used as alternatives to chromium for the adhesion layer. Two-layer UBMs with a gold flash coating are also known, as are single-layer UBMs.

A second layer of etchant-resistive photoresist film 35 is applied to a face surface 38 of the third metal layer 32. The second photoresist film 35 is then masked, exposed, and stripped to form at least one second etchant-resistive block 36 over the via 22, as shown in FIG. 1f. The metal layers 28, 30, and 32 surrounding via 22 are then etched and the etchant-resistive block 36 is stripped to form a discrete UBM pad 40, as shown in FIG. 1g. A solder bump 42 is then formed on the UBM pad 40, as shown in FIG. 1h, by any known industry technique, such as stenciling, screen printing, electroplating, electroless plating, evaporation or the like.

The UBM pads 40 can also be made by selectively depositing the metal layers by evaporation through a mask (or photoengraving) onto the passivation film face surface 20 as well as the via 22 such that the metal layers 28, 30, and 32 correspond to the exposed portions of the conductive traces 14.

Solder balls are generally formed of lead and tin. High concentrations of lead are sometimes used to make the bump more compatible with subsequent processing steps. Tin is added to strengthen bonding (to such metal as copper) and serves as an antioxidant. High-temperature (melting point ≈315° C.) solder alloy has been used to join chips to thick ceramic substrates and multi-layer cofired ceramic interface modules. Joining chips to organic carriers such as polyimide-glass, polyimide-aramid and the like as well as the printed wiring boards requires lower temperatures which may be obtained by using 63Sn/37Pb solder (melting point 183° C.) and various Pb/In alloys such as 50Pb/50In (melting point ≈220° C). Lower melting point alloys (down to 60° C.) have been used to bump very temperature-sensitive chips such as GaAs and superconducting Josephson junctions.

Numerous techniques have been devised to improve the UBM and formation of solder bumps for flip chips. For example, U.S. Pat. No. 4,360,142 issued Nov. 23, 1982 to Carpenter et al. relates to forming multiple layer UBM pads between a semiconductor device and a supporting substrate particularly suited to high stress use conditions that generate thermal gradients in the interconnection.

U.S. Pat. No. 5,137,845 issued Aug. 11, 1992 to Lochon et al. pertains to a method of forming solder bumps and UBM pads of a desired size on semiconductor chips based on an involved photolithographic technique such that the dimensions of the solder bumps can be reduced in order to increase the number of bumps on a chip.

U.S. Pat. No. 5,470,787 issued Nov. 28, 1995 to Greer relates to a substantially cylindrical layered solder bump wherein the bump comprises a lower tin layer adjacent to the UBM pad, a thick lead layer, and an upper tin layer to provide an optimized, localized eutectic formation at the top of the bump during solder reflux.

U.S. Pat. Nos. 4,906,341; 5,293,006; 5,341,946; and 5,480,835 also disclose materials and techniques for forming UBM pads and solder bumps.

All of the above patents and prior art techniques for forming UBM pads and solder bumps are relatively complex and require a substantial number of discrete steps to form the flip chip conductive bumps. Therefore, it would be advantageous to develop a more efficient technique for forming conductive bump structures on a flip chip to eliminate some of the steps required by present industry standard techniques while using commercially-available, widely-practiced semiconductor device fabrication materials and techniques.

SUMMARY OF THE INVENTION

The present invention relates to an improved method for forming under bump metallurgy ("UBM") pads for a flip chip. The present invention provides a simpler, improved UBM formation process which eliminates a prior art mask step employed to remove excess metallization surrounding the metallized vias, or to mask around vias to prevent metallizations of the surrounding passivation layer.

A preferred method of forming UBM pads and flip chip solder bump connections of the present invention comprises providing a semiconductor wafer with a plurality of semiconductor elements (dice) on at least one wafer surface and a plurality of conductors on the wafer surface in communication with their respective semiconductor elements. The semiconductor wafer also includes a passivation film or layer with vias formed therein to expose selected surfaces of the conductors.

In practicing the invention, it is desirable to employ a sloped-wall via for the formation of the UBM since sloped (faceted) edges or walls of a via assist in forming the spherical solder ball when the initially-deposited solder is heated. A sloped edge via can be attained either by sputter etching or wet etching. Sputter etching creates an angled facet resulting from the dependence of sputter etch rate on the angle of incidence of ions striking the surface. The faceting effect arises from the fact that sputtering yield is greater from surfaces which are inclined at a non-90° angle to the incoming ions. When a protective layer (such as an etch resist layer with openings in desired locations) is used during a sputter etch, the facet will initially develop in the resist layer and then will be indirectly transferred into the substrate as the etching progresses. A wet etch technique involves using an etch resist layer with openings in desired locations over a substrate. An acid solution is applied to the surface of the wafer, the acid etching the substrate down to the conductive electrode defining a concave etch pit. The curved sides of the concave pit formed in the substrate serve as the sloped walls of the via on which to form the UBM pad.

At least one metal layer is distributed across the surface of the passivation film and into the vias. A rotating polishing pad is then used to make flush contact with the metallized wafer surface and abrade away the metal layer down to the passivation film. However, the metal layer portion residing within the vias is undisturbed by the polishing pad remaining as a UBM structure. A solder bump is then formed on the UBM structure. Thus, this method forms UBM without using a masking step for removing the metal layer while providing an appropriately-shaped UBM with sufficient area to form and constrain the solder bump.

The technique of using a rotating polishing pad is known in the industry as chemical mechanical polishing (planarizing) or "CMP" (see U.S. Pat. 5,449,314 issued Sep. 12, 1995 to Meikle et al.). CMP involves holding a semiconductor wafer against a rotating wetted polishing platen or pad under controlled chemical, pressure and temperature conditions. Typically an aqueous colloidal silica solution is used as the abrasive fluid. The effective polishing mechanism is a combination of the mechanical action and the chemical reaction of the material being polished with the aqueous solution.

Another preferred method of forming UBM pads and flip chip solder bump connections of the present invention comprises providing the metal layered, viaed semiconductor wafer as described above. A layer of etch resist film is applied to the metal layer on the semiconductor wafer such that the metal coated vias are filled with the etch resist film. The film may comprise a photoresist (either positive or negative), or any other suitable material, as subsequently noted, which is not attached by the etchant to be employed to remove the metal layer on the face surface of the passivation layer. A rotating polishing pad then makes flush contact with the etch resist film and quickly abrades away the etch resist film down to the metal layer face or outer surface, but does not remove the portion of etch resist film remaining within the vias. The now-exposed metal layer is then etched away. The method may also be employed without removal of the etch resist film over the passivation layer, the deeper resist in the vias protecting the metallization therein. The etch resist film in the vias is stripped away, leaving the UBM pad. A solder bump is then formed on the UBM pad.

The present invention may also be utilized for repatterning an active surface of a flip chip. Repatterning may be necessary or desirable to reposition the location of at least one bond pad or electrical contact site of an existing semiconductor die in order to attach the die to a PCB or other substrate, or the like. The process begins with a semiconductor wafer or substrate with at least one pre-existing bond pad. A first layer of passivation film is placed over the surface of the semiconductor wafer on which the bond pad is located. The passivation film is masked and etched to form a bond pad via through the passivation film to the bond pad. A conductive layer, preferably aluminum, is formed over a face surface of the passivation film. The conductive layer is masked and etched to form at least one conductive repattern trace. A second passivation film is applied over the conductive repattern trace. An etch resist layer is applied over an upper surface of the second passivation film, masked, and etched to form a resist via. A sloped wall or faceted via at an alternative bond pad location to which the repattern trace extends is then etched through the exposed second passivation film according to industry standard techniques. The etch resist layer is stripped and a metal layer is applied over the second passivation film upper surface and into the faceted via. A UBM pad is subsequently formed according to the methods of the present invention described above, and a solder ball is formed on the UBM pad.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

BEST MODE OF THE INVENTION

Figure 1A:
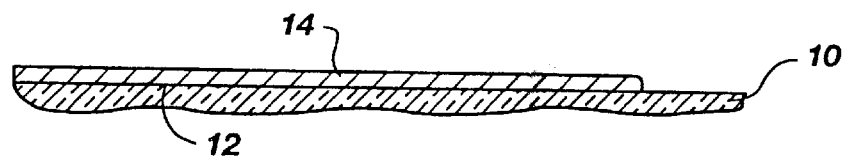
FIGS. 1a–1h are side cross sectional views of a prior art process of forming flip chip solder bump connections.
Figure 1B:
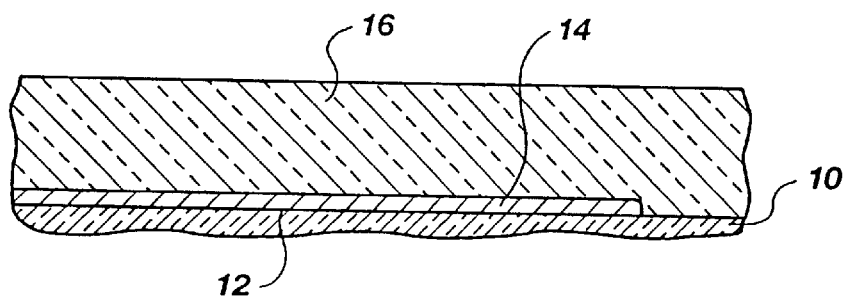
Figure 1C:
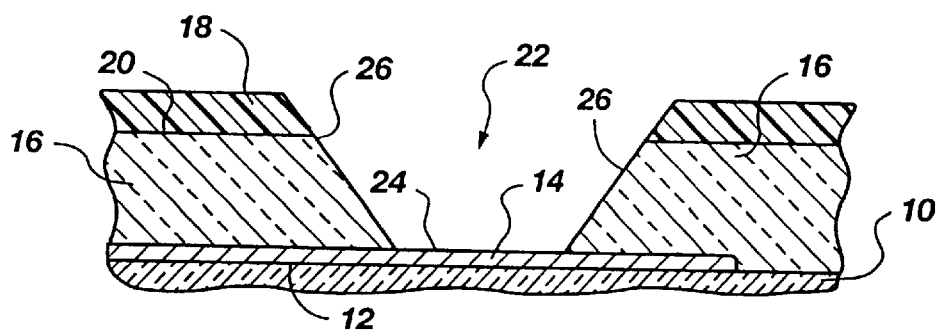
Figure 1D:
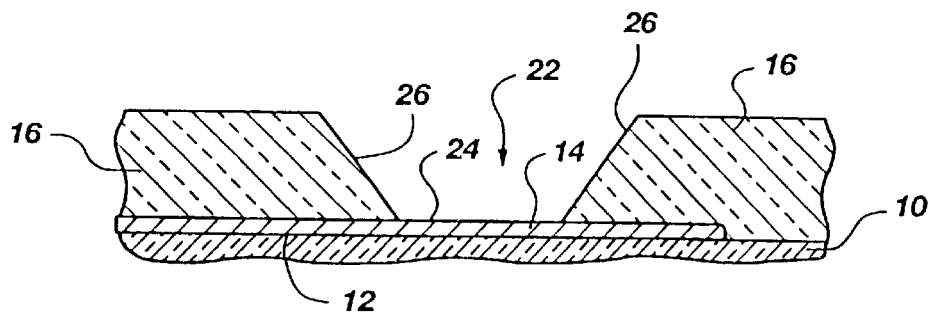
Figure 1E:
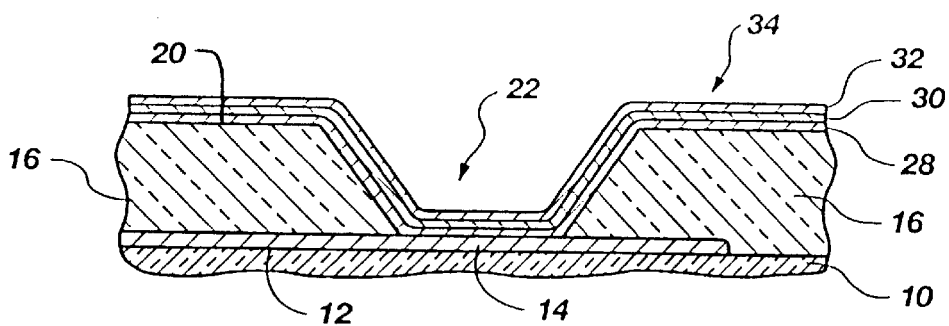
Figure 1F:
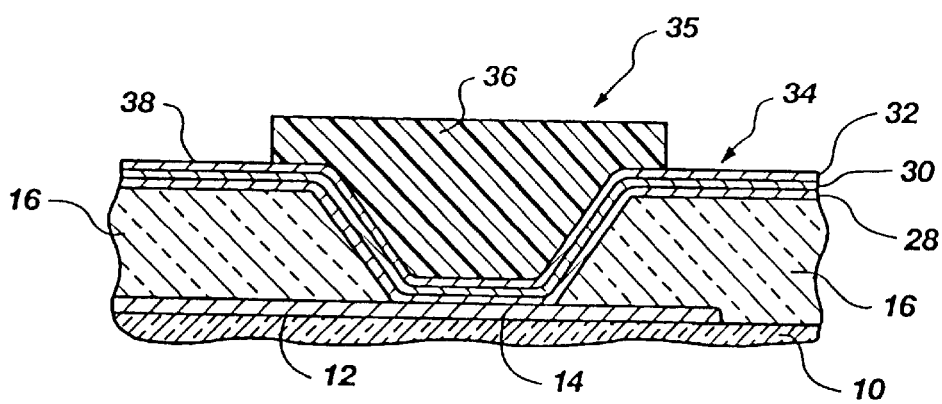
Figure 1G:
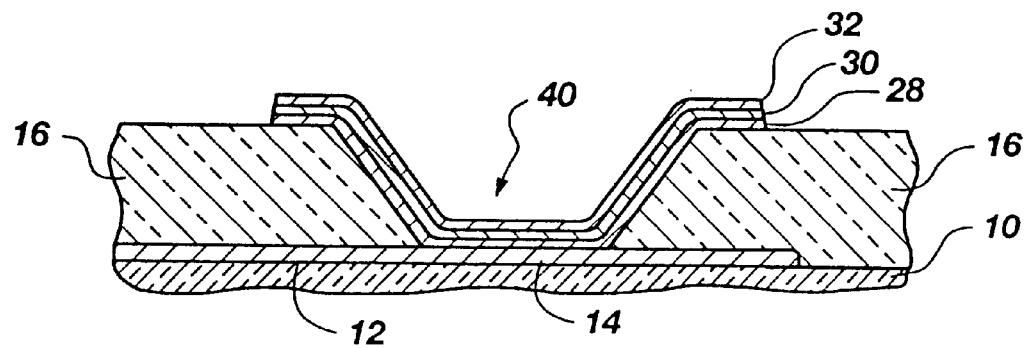
Figure 1H:
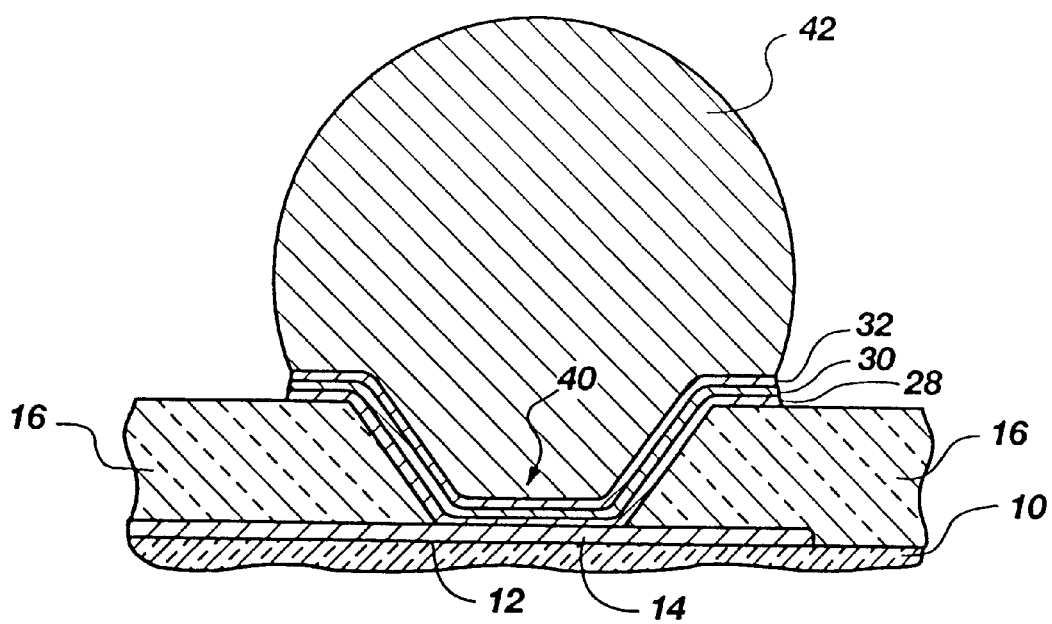
Figure 2A:
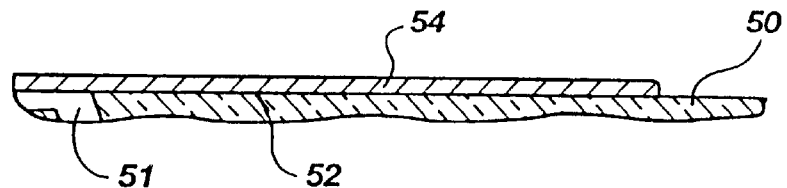
FIGS. 2a–2e are side cross sectional views of a method of forming the metal coated, via-containing wafer surface of the present invention.
Figure 2B:
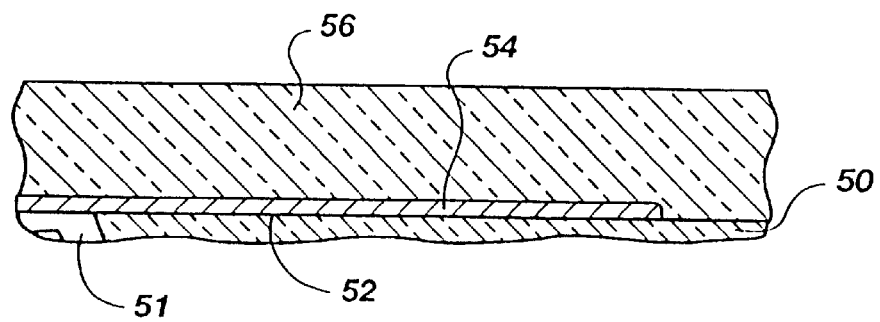
Figure 2C:
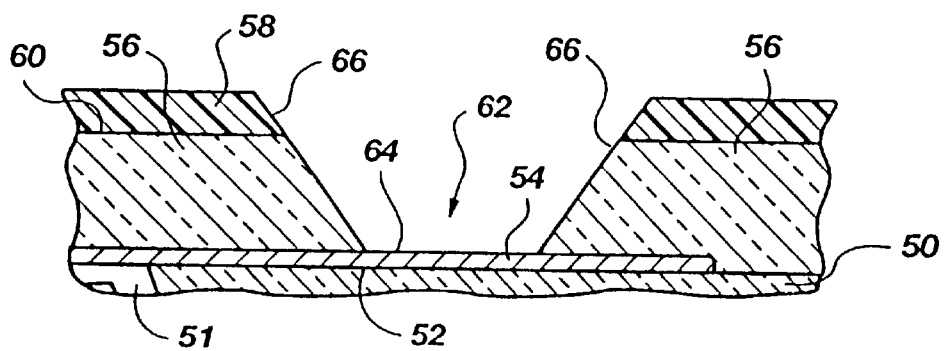
Figure 2D:
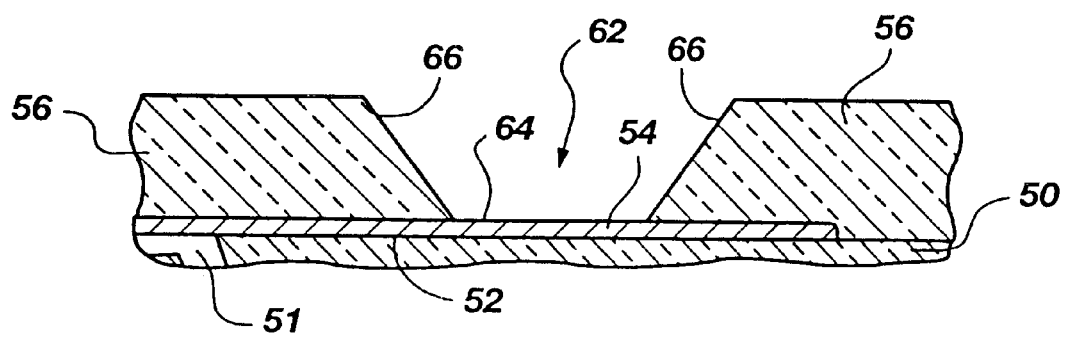

FIGS. 2a–2e show the initial steps of a method of forming a metal layered wafer as employed in the present invention, only these initial steps being substantially similar to known prior art techniques. A plurality of semiconductor elements (dice) including integrated circuitry 51 is formed on a face surface 52 of a semiconductor wafer 50. A plurality of conductive traces or bond pads 54, preferably aluminum traces or pads, is formed on the semiconductor wafer face surface 52 positioned to contact circuitry of respective semiconductor elements (not shown), as shown in FIG. 2a. A passivation film 56 such as one or more layers of $SiO_2$ film, $Si_3N_4$ film, or the like (sometimes doped with boron, phosphorous or both to enhance protective properties), is formed on the semiconductor wafer face surface 52 as well as over the conductive traces or pads 54, as shown in FIG. 2b. A single layer of $Si_3N_4$ is preferred, alone or with a superimposed polyimide layer. A first layer of etch resist film 58 such as a photoresist is applied to a face surface 60 of the passivation film 56. The first etch resist film 58 is then masked, exposed, and stripped to form desired openings or apertures in the first etch resist film 58. The passivation film 56 is then etched through the resist apertures to form sloped vias 62 (one illustrated) with sloped edges or walls 66 which exposes a face surface 64 of the underlying conductive trace or pad 54, as shown in FIG. 2c. The etch resist film 58 is subsequently stripped, leaving the structure shown in FIG. 2d.

Figure 2E:
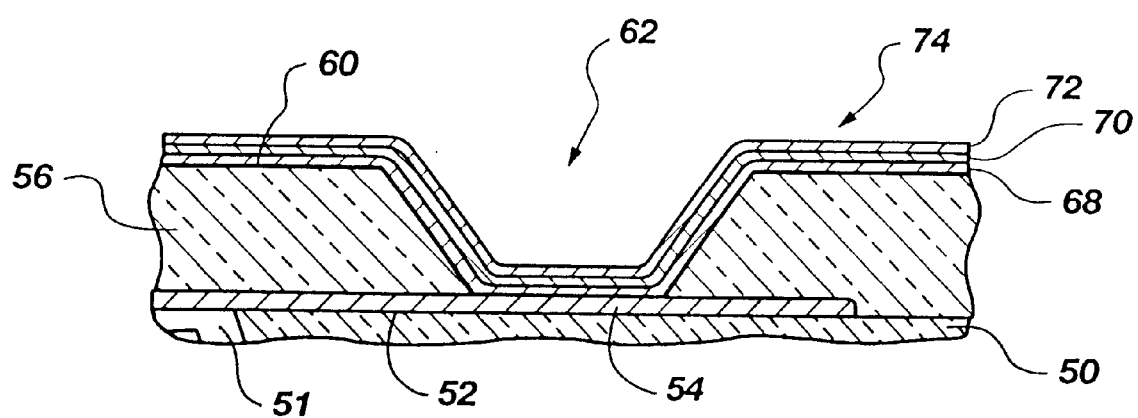

FIG. 2e shows metal layers 68, 70, and 72 applied over the passivation film face surface 60 as well as the via 62 to form a composite or laminate UBM 74 by CVD, PECVD, or PVD such as sputtering or evaporation. The metal layers usually comprise chrome for the first layer 68, chrome-copper alloy for the second layer 70, and copper for the third layer 72. Each of these layers may be about 1000 Å thick, although this is not a requirement of the invention. Additionally, a fourth metal layer (not shown) of gold may be deposited or flashed atop the copper third layer 72 to prevent oxidation of the copper. As noted previously, a multitude of other acceptable metals may be used as metal layers. For example, a Ti/TiW/Cu stack or laminate provides another suitable combination. The invention is not limited to any particular UBM metallurgy or to multi-layer UBMs.

Figure 3A:
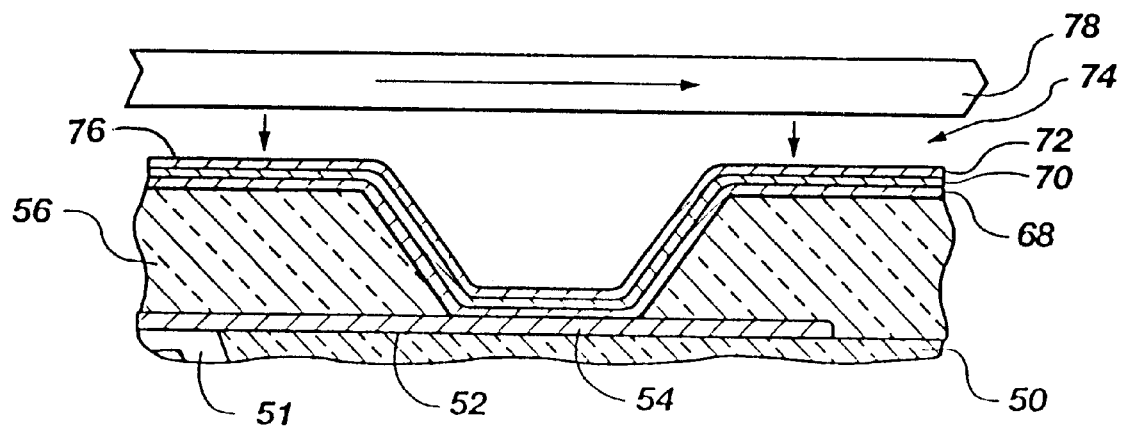
FIGS. 3a–3d are side cross sectional views of a preferred method of forming UBM pads and flip chip solder bump connections of the present invention.
Figure 3B:
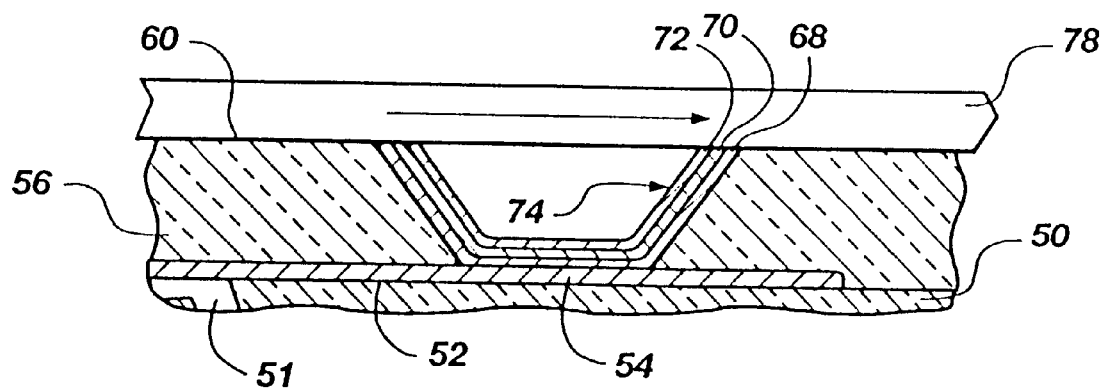
Figure 3C:
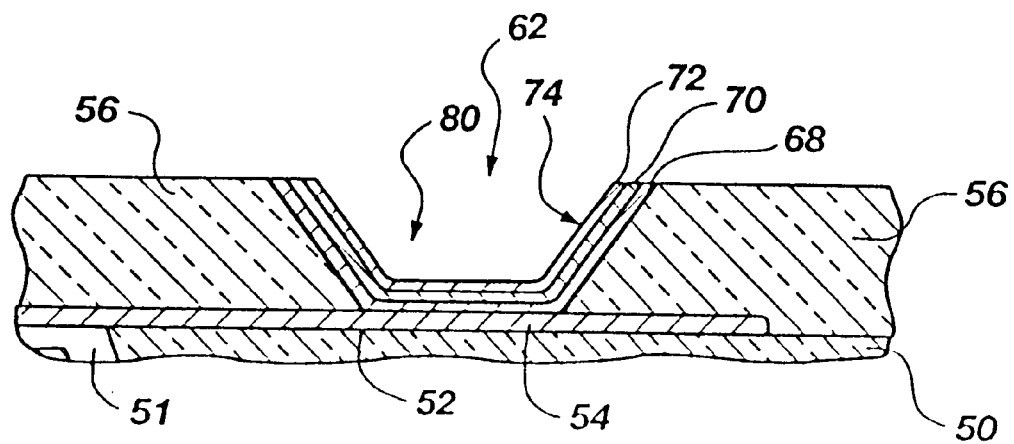
Figure 3D:
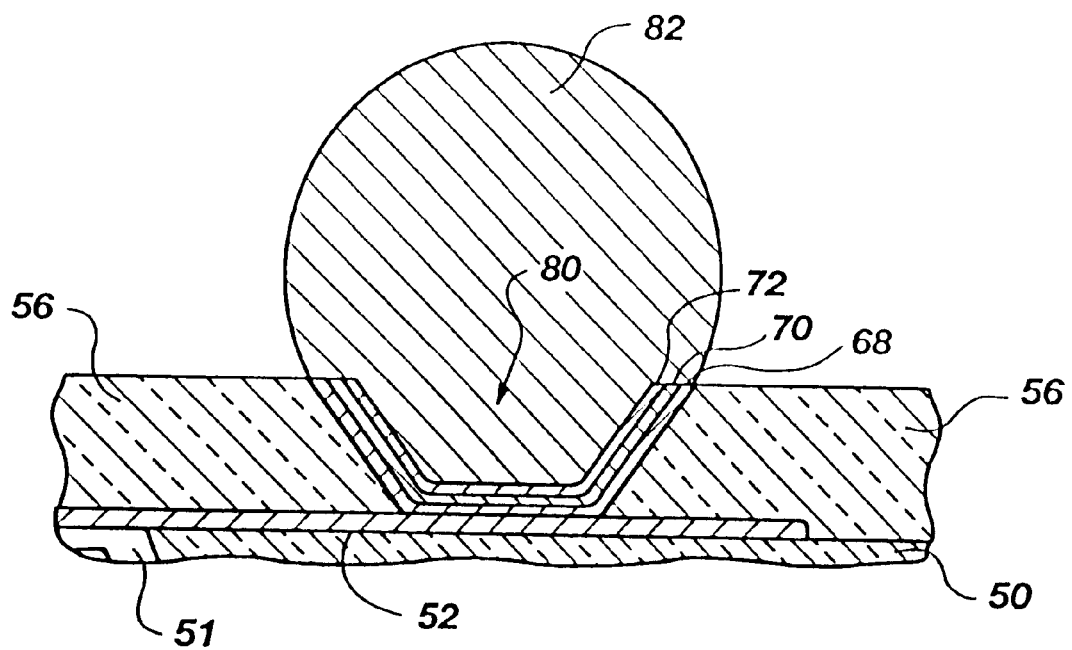

FIGS. 3a–3d illustrate a first preferred method of forming UBM structures and flip chip solder bump connections of the present invention. Components common to FIGS. 2a–2e and FIGS. 3a–3d retain the same numeric designation. FIGS. 3a and 3b show a rotating polishing pad 78 positioned for making flush contact with an upper surface 76 of metal layer 72 of UBM 74 as previously illustrated in FIG. 2e. In practice, FIGS. 3a and 3b are inverted, as normally wafer 50 is polished face-down on pad 78 in a standard CMP technique as previously noted. However, the figures are depicted as shown for clarity in disclosing the present invention. The polishing pad 78 completely abrades away the metal layers 68, 70, and 72 down to the passivation film face surface 60, as shown in FIG. 3b. This abrasion results in the formation of discrete UBM structures 80 in the metal-covered sloped vias 62, one of which UBM structure 80 is shown in FIG. 3c. A solder bump 82 is then formed on the UBM structure 80, as shown in FIG. 3d, by any known industry technique, such as stenciling, screen printing, electroplating, electroless plating, evaporation or the like.

FIGS. 4a–4e illustrate another preferred method of forming UBM structures and flip chip solder bump connections of the present invention. Components common to FIGS. 2a–2e, 3a–3d, and FIGS. 4a–4e retain the same numeric designation. A second layer of etch resist film 84 (the first being that used in formulation of via 62) such as a photoresist is applied to an exposed face surface 76 of the third metal layer 72 of UBM 74 such that the via 62 is filled with second etch resist film 84. The entire etch resist film 84 is then exposed; no mask is required. The etch resist film 84 may comprise any suitable material known in the art. It should also be noted that other polymer, dielectric or even metal films may be employed in lieu of the resist, the only constraining parameter being that the etch subsequently used to remove the metal layers 68, 70 and 72 down to passivation film face surface 60 is selective and does not attack the material employed for etch resist film 84.

Figure 4A:
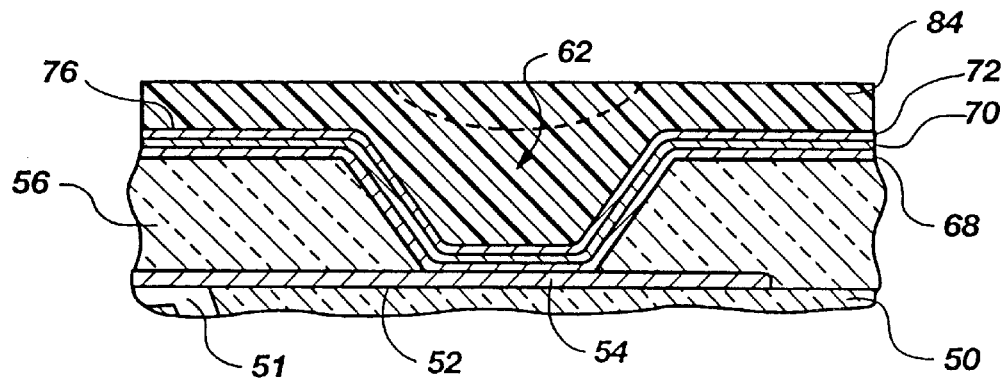
FIGS. 4a–4e are side cross sectional views of another preferred method of forming UBM pads and flip chip solder bump connections of the present invention.
Figure 4B:
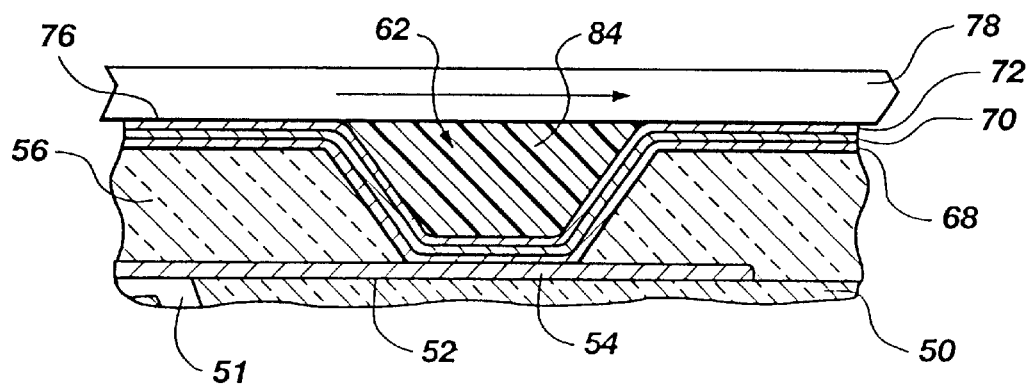
Figure 4C:
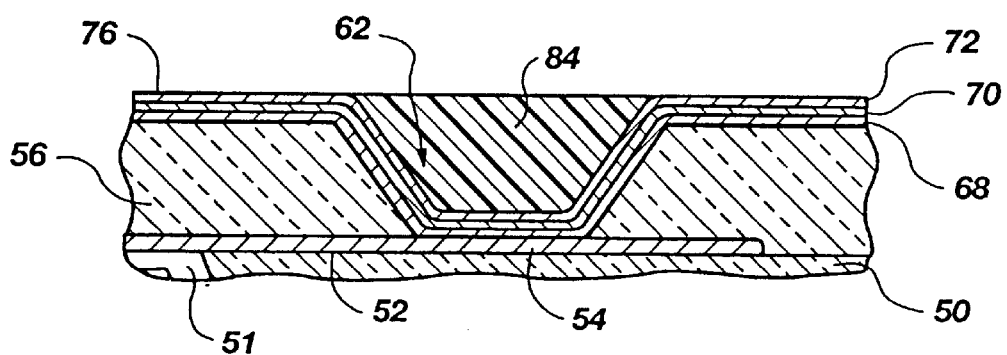
Figure 4D:
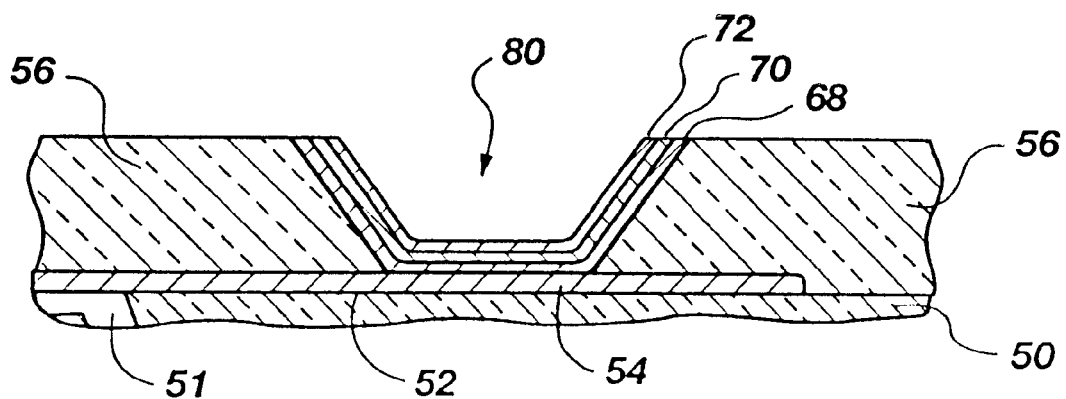
Figure 4E:
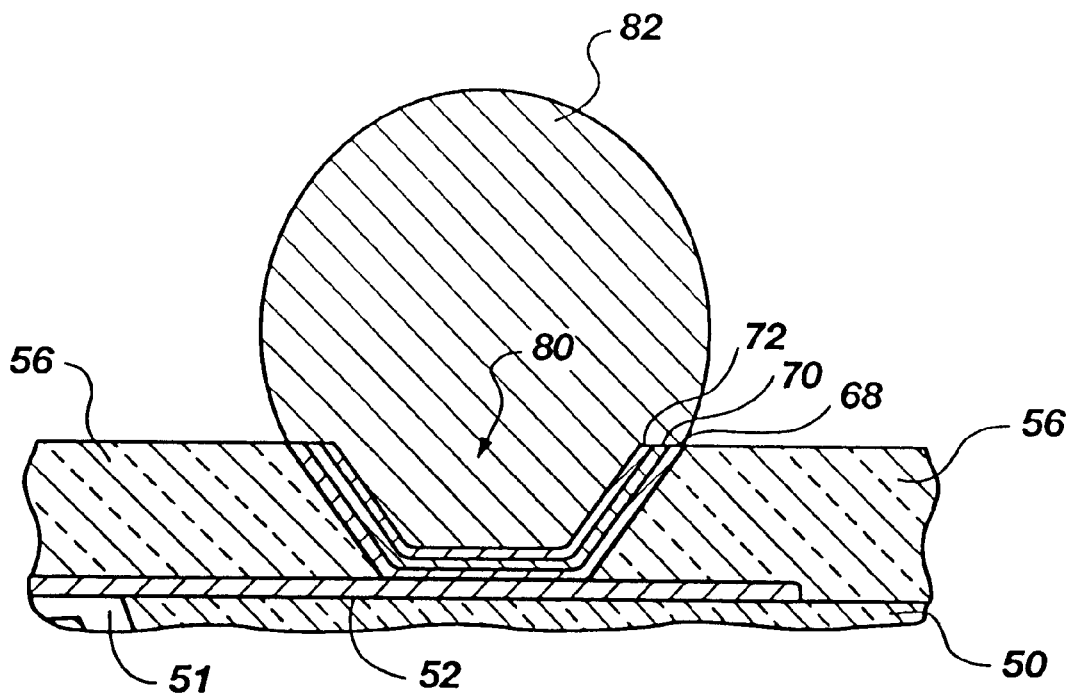

The wafer 50 is then applied face-down to rotating polishing pad 78, which makes flush contact with the second etch resist film 84 and abrades the second etch resist film 84 down to the third metal layer face surface 76, as shown in FIG. 4b. However, the portion of exposed, second etch resist film 84 within the via 62 such as remains, as shown in FIG. 4c, protects UBM 74 therein. Second etch resist film 84 need not fill via 62, but only cover metal layer 72 completely to a depth greater (see broken lines in FIG. 4a) than that over the metal layer 68 overlying the passivation film 56. The exposed metal layers 68, 70, and 72 on the surface of passivation film 56 are subsequently etched away by any known industry standard technique, including without limitation wet etch, dry etch and CMP. The second etch resist film 84 in vias 62 is stripped away, leaving the UBM structure 80, as shown in FIG. 4d. A solder bump 82 is then formed on the UBM structure 80, as shown in FIG. 4e, by any known industry technique, such as stenciling, screen printing, electroplating, electroless plating, evaporation, sputtering or the like.

Another preferred alternative omits the scrubbing or removal of film 84 by CMP, and employs an etch of the etch resist film 84 and underlying UBM 74. The deeper or thicker photoresist or other resist disposed in vias 62 prevents damage (etching) to the UBM 74 in the vias 62. When the etch of UBM 74 is completed, the etch resist film 84 in the vias 62 is stripped, leaving UBM structure 80. Depending upon etch rate, this technique may be faster or slower than the variation wherein the resist film over the passivation layer is removed by CMP prior to etching. It should be noted that etch resist film 84 should fill vias 62 in the practice of this embodiment; otherwise etchant damage to the via metallization is probable.

Figure 5:
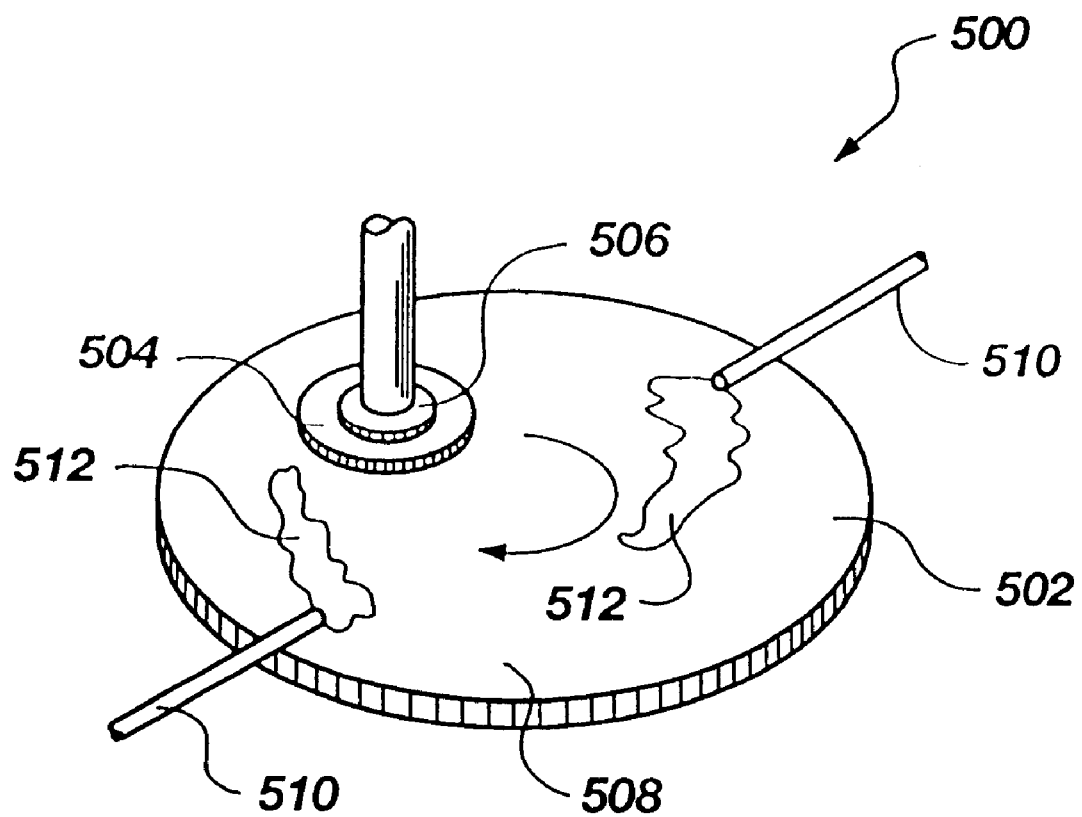
FIG. 5 is a perspective view of an abrasive polishing pad assembly used in the method of the present invention.

FIG. 5 shows a perspective view of an abrasive polishing pad or CMP assembly 500 used in the method of the present invention. The polishing pad assembly 500 comprises a rotating polishing pad 502 and a pressure/wafer holding apparatus 506. The pressure/wafer holding apparatus 506 holds a semiconductor wafer 504 against an upper surface 508 of the polishing pad 502, imparts a desired pressure on the wafer 504, and may also rotate wafer 504 in some instances. The polishing pad assembly 500 further includes at least one dispensing element, such as tubes 510, for delivering an abrasive fluid 512, such as an aqueous colloidal silica solution or the like, to the polishing pad upper surface 508.

FIGS. 6a–6d illustrate a sputter etching process for forming sloped vias 62. Components common to the previous figures and FIGS. 6a–6d retain the same numeric designation. The process begins with providing a semiconductor wafer assembly 600 (see FIG. 6a) comprising the semiconductor wafer 50 with the plurality of semiconductor elements (dice) including integrated circuitry (not shown) formed on the face surface 52 and with the plurality of conductive traces and bond pads 54 also formed on the semiconductor wafer face surface 52 positioned to contact respective semiconductor element circuitry (not shown). A passivation film 56 is disposed over the semiconductor wafer face surface 52 as well as the conductive traces and pads 54. A first layer of etch resist film 58 such as a photoresist is applied to the face surface 60 of the passivation film 56, is then masked, exposed, and stripped to form desired openings 602 (one illustrated) in the first etch resist film 58.

Figure 6A:
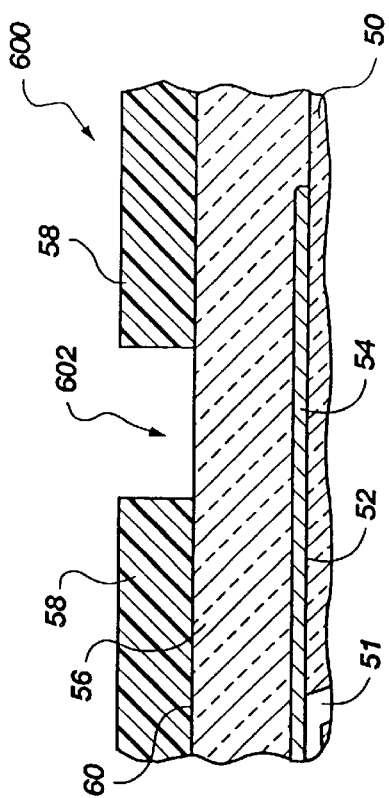
FIGS. 6a–6d illustrate a sputter etching process for forming sloped vias.
Figure 6B:
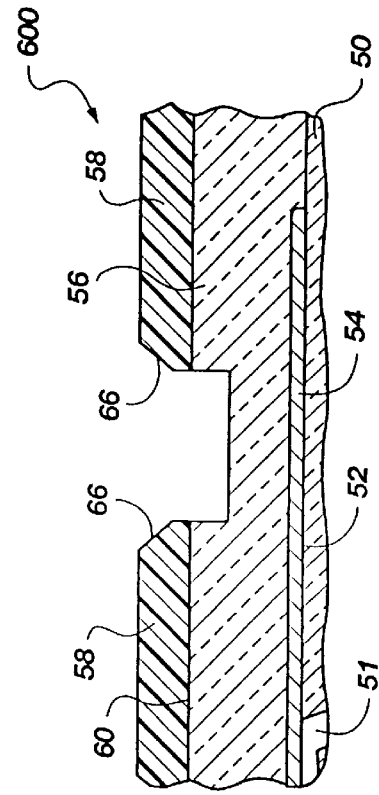
Figure 6C:
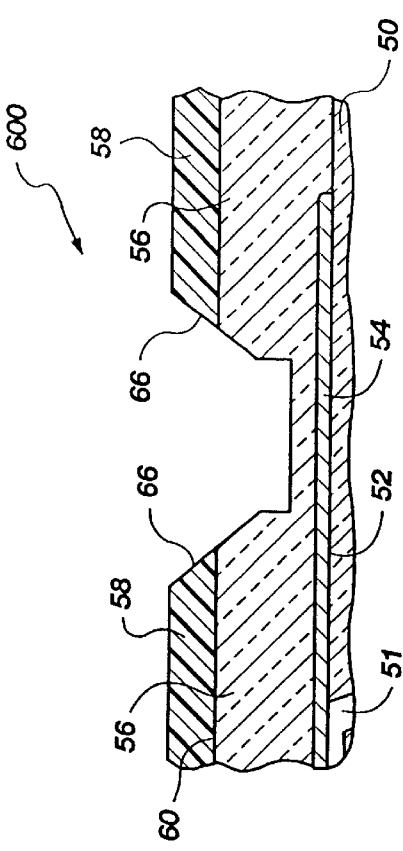
Figure 6D:
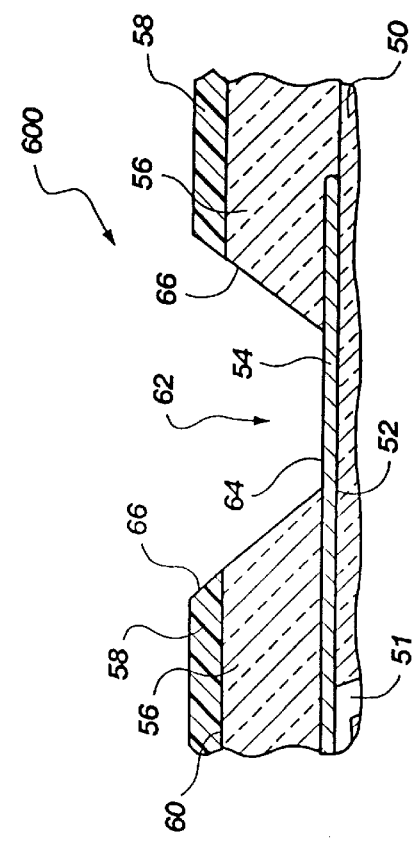

FIG. 6b shows the effect of sputter etching after a short period of time wherein the sloped edges 66 begin to form on the etch resist film 58 as the wafer 50 is sputtered and both resist film 58 and passivation film 56 are etched. The sputtering process continues and sloped edges or walls 66 begin to form in the passivation film 56 after resist film 58 is penetrated, as shown in FIG. 6c. FIG. 6d shows the results of the completed sputter etching in the form of the sloped via 62 which extends to and exposes the face surface 64 of the conductive trace 54 and includes sloped edges or walls 66 extending thereto.

Figure 7A:
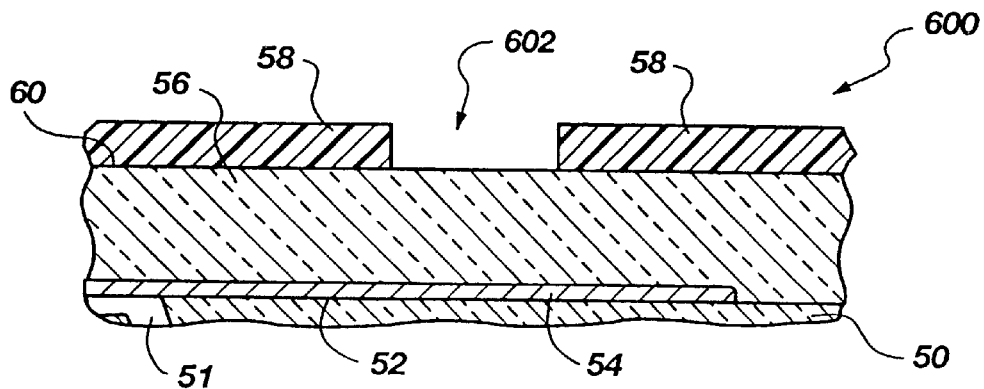
FIGS. 7a–7c illustrate a wet etching process for forming sloped vias.
Figure 7B:
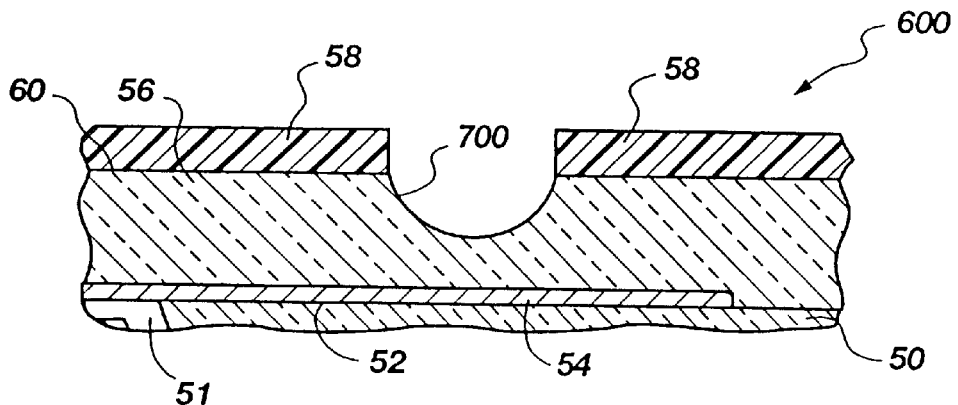
Figure 7C:
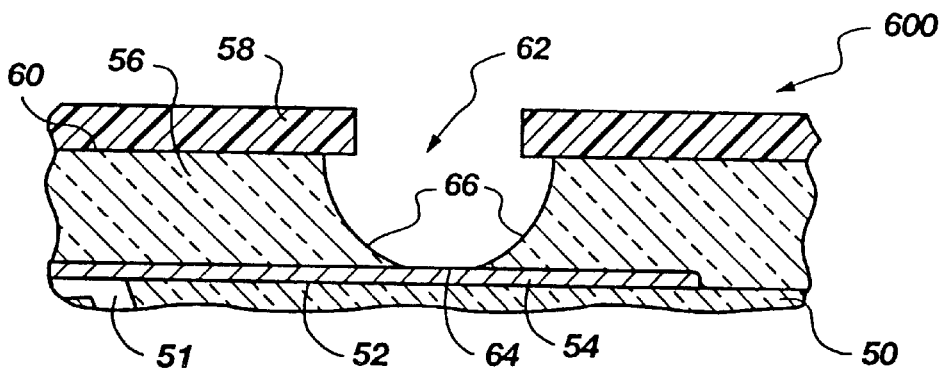

FIGS. 7a7c illustrate an exemplary wet etching process for forming sloped vias 62. Components common to the previous figures and FIGS. 7a–7c retain the same numeric designation. The process begins with providing a semiconductor wafer assembly 600 (see FIG. 7a) comprising the semiconductor wafer 50 with the plurality of semiconductor elements or circuitry (not shown) formed on the face surface 52 and with the plurality of conductive traces and bond pads 54 also formed on the semiconductor wafer face surface 52 positioned to contact respective semiconductor element circuitry (not shown). A passivation film 56 is disposed over the semiconductor wafer face surface 52 as well as the conductive traces and pads 54. A first layer of etch resist film 58 (photoresist or other film, depending upon the intended etchant and temperature) is applied to the face surface 60 of the passivation film 56. The first etch resist film 58 is then masked, exposed, and stripped to form desired opening 602 in the first etch resist film 58.

An appropriate acid such as a 1:2 ratio mix of ammonium fluoride and acetic acid or a 100:1 ratio mix of $H_2O$ and HF acid for etching an $SiO_2$ film, or hot (150–180° C.) phosphoric acid in the case of an $Si_3N_4$ film is then applied to the surface of the wafer. Other suitable etchants, as known in the art, may be employed in the case of polymer-based films such as polyimides. FIG. 7b shows the effect of this acid etching after a short period of time wherein a concave recess 700 begins to form on the passivation film 56. The process continues until the etching forms the sloped via 62 having somewhat arcuate or curved sloped edges 66 and which exposes the face surface 64 of the conductive traces 54, as shown in FIG. 7c. Etch resist film 58 is then stripped. An etch performed as described above forms a wall angle of the via with respect to the horizontal which is desirable for solder ball formation by increasing surface area exposed to shear forces.

Figure 8A:
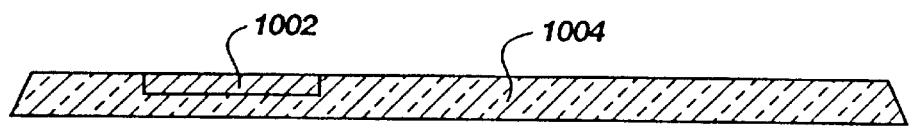
FIGS. 8a–8j illustrate a method for repatterning the active surface of a flip chip.
Figure 8B:
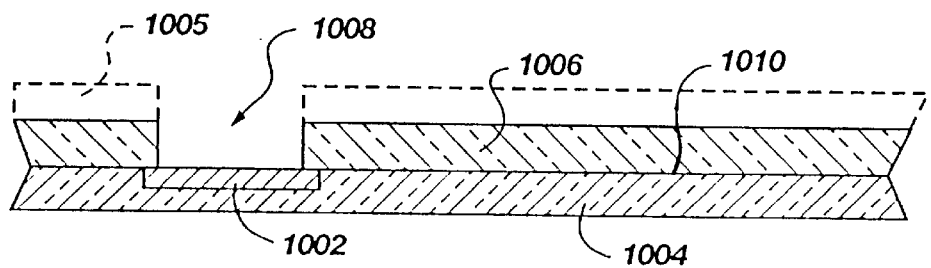
Figure 8C:
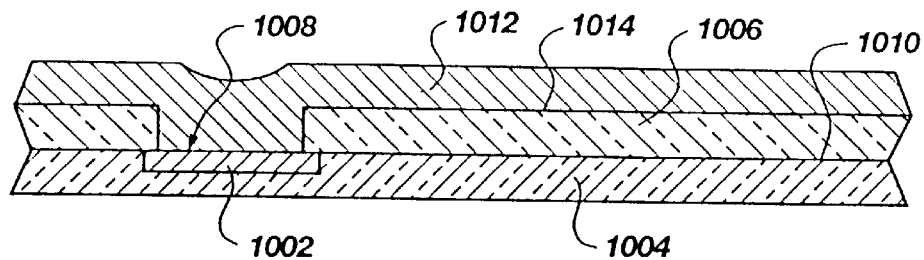
Figure 8D:
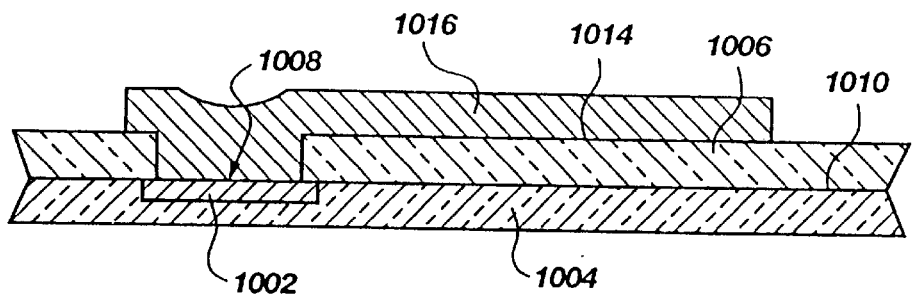
Figure 8E:
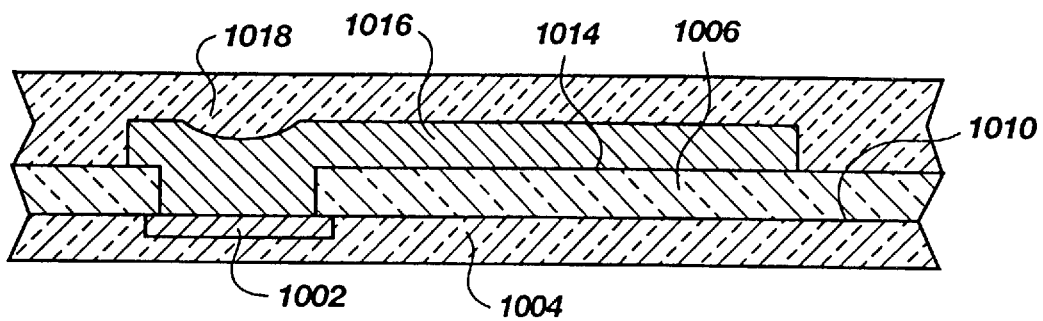
Figure 8F:
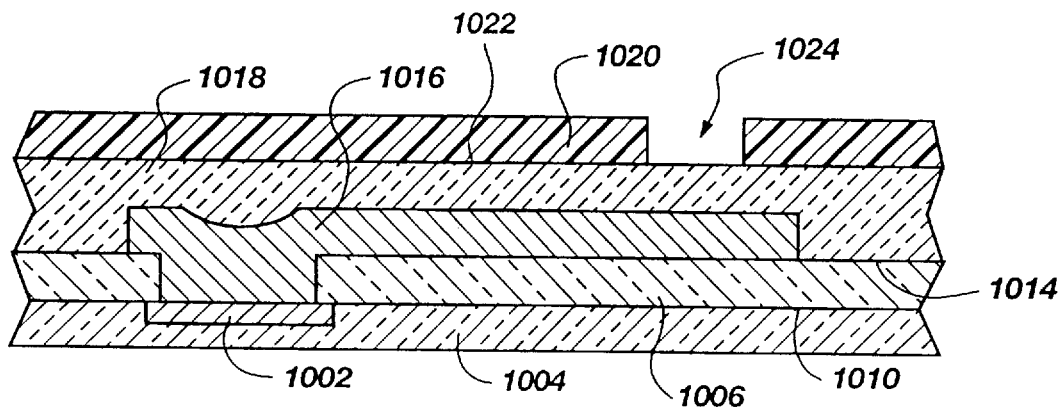
Figure 8G:
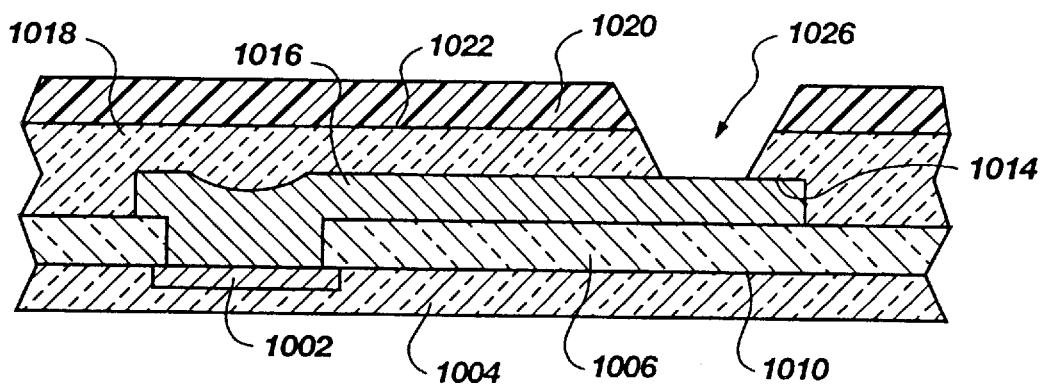
Figure 8H:
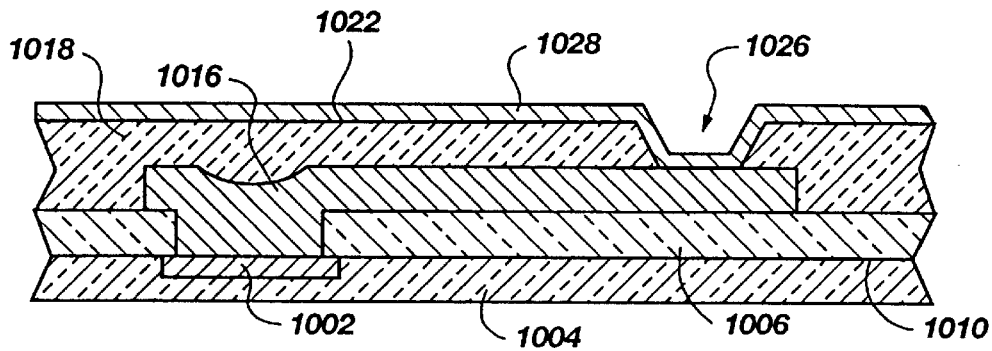
Figure 8I:
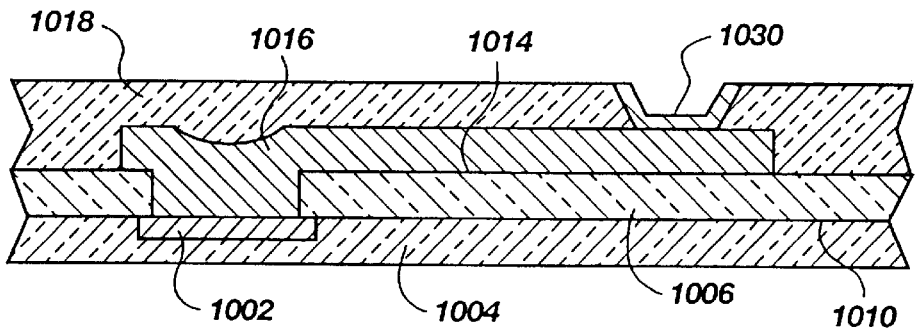
Figure 8J:
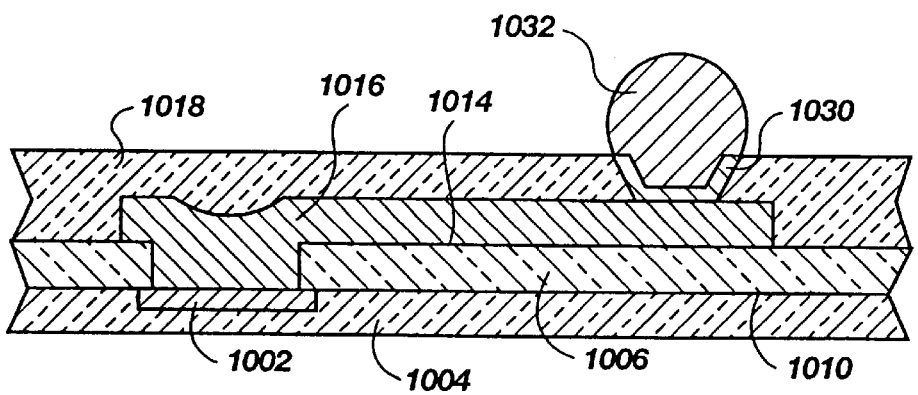

FIGS. 8a–8j illustrate a method for repatterning an active surface of a flip chip. The process begins with a substrate or semiconductor wafer 1004 including a bond pad 1002, as shown in FIG. 8a, bond pad 1002 being in communication with circuitry such as 51 illustrated previously. A first layer of passivation film 1006 as previously described is applied over a face surface 1010 of the semiconductor wafer 1004. A photoresist 1005 is applied, masked and exposed, (broken lines in FIG. 8b). The passivation film 1006 is then etched to form a bond pad via 1008 through the passivation film 1006 to the bond pad 1002, as shown in FIG. 8b. A conductive layer 1012, preferably aluminum, is applied over a face surface 1014 of the passivation film 1006, as shown in FIG. 8c. The conductive layer 1012 is then photoresist-coated, masked, exposed and etched to form at least one conductive repattern trace 1016 extending to a substitute or alternative bond pad location, as shown in FIG. 8d. A second passivation film 1018 such as a spin-on polyimide layer is applied over the conductive repattern trace 1016, as shown in FIG. 8e. An etch resist layer 1020 (photoresist) is applied over an upper surface 1022 of the second passivation film 1018, masked, and etched to form a resist via 1024 at the alternative, repatterned bond pad location, as shown in FIG. 8f. A faceted or sloped-wall via 1026, as shown in FIG. 8g, is etched according to the methods of the present invention as described above with respect to FIGS. 6a–6d or FIGS. 7a–7c. The etch resist layer 1020 is stripped and a metal layer 1028 (which may comprise a multilayer structure as previously discussed) is applied over the second passivation film upper surface 1022, as shown in FIG. 8h. A UBM structure 1030, as shown in FIG. 8i, is formed according to the methods of the present invention described above in FIGS. 3a–3d or FIGS. 4a–4e. A solder ball 1032 is formed on the UBM structure 1030, as shown in FIG. 8j.

It is, of course, understood that, although the above description is generally directed to fabrication on a wafer scale, the method is equally applicable to single chips or portions of wafers.

It will also be understood that a solid preform comprising a "blank" of substrate material (such as Si) may be employed over the exposed trace ends of the wafer to define vias anisotropically wet-etched and plated with metal to define the UBM. For purposes of this invention, a preform Si blank may also be considered as a passivation layer. Techniques for such via and UBM formation are disclosed in copending U.S. patent application Ser. No. 08/612,059 filed Mar. 7, 1996 and assigned to the assignee of the present invention, the disclosure of which is incorporated herein by this reference. The anisotropic wet etch of the silicon blank may be effected by a KOH:$H_2O$ mixture, resulting in a preferred 54° via wall angle to the horizontal for formation of a solder ball therein.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A semiconductor device, comprising:
    a semiconductor substrate including integrated circuitry;
    at least one passivation layer having a thickness and disposed over said semiconductor substrate, said at least one passivation layer including at least one via extending through said at least one passivation layer; and
    a substantially conformal metal layer of a thickness substantially less than the passivation layer thickness disposed within said at least one via, wherein edges of said substantially conformal metal layer are substantially flush with an exposed surface of said passivation layer defining a discrete metal-covered via for connection with external electrical components.

2. The semiconductor device of claim 1, wherein said at least one passivation layer is selected from the group consisting of $SiO_2$, $Si_3N_4$ and polyimide.

3. The semiconductor device of claim 1, wherein said at least one passivation layer comprises a plurality of superimposed passivation layers.

4. The semiconductor device of claim 3, wherein at least one of said plurality of passivation layers is selected from the group consisting of $SiO_2$, $Si_3N_4$ and polyimide.

5. The semiconductor device of claim 1, wherein said substantially conformal metal layer is comprised of a plurality of sub-layers of different metallic composition.

6. The semiconductor device of claim 1, wherein said integrated circuitry is in electrical communication with said at least one via through a conductive trace exposed within said at least one via, and said substantially conformal metal layer is in contact with said trace.

7. The semiconductor device of claim 1, wherein said at least one via is formed by etching.

8. The semiconductor device of claim 7, wherein said etching is selected from the group comprising sputter etching and wet etching.

9. The semiconductor device of claim 7, wherein said etching comprises sputter etching effected after application of a resist layer over said at least one passivation layer defining an intended location of said at least one via.

10. The semiconductor device of claim 7, wherein said etching comprises wet etching effected after application of a resist layer over said at least one passivation layer defining an intended location of said at least one via.

11. The semiconductor device of claim 1, further comprising a solder mass deposited over said at least one via.

12. An under bump metallization formed in at least one via defined in at least one passivation layer over a semiconductor substrate, wherein edges of said under bump metallization are substantially flush with an exposed surface of said passivation layer to define a discrete metal-covered via for connection with external electrical components, fabricated by a method comprising:
    providing said semiconductor substrate including integrated circuitry, and said at least one passivation layer having a thickness and disposed over said semiconductor substrate;
    providing access to said integrated circuitry for external contact by forming said at least one via extending through said at least one passivation layer;
    forming a substantially conformal metal layer of a thickness substantially less than the passivation layer thickness over said at least one passivation layer with a portion of said metal layer extending into said at least one via to make electrical contact with said integrated circuitry; and
    removing said metal layer only above said at least one passivation layer by abrasive contact.

13. The under bump metallization of claim 12, wherein said abrasive contact is effected by CMP.

14. The under bump metallization of claim 12, wherein said at least one passivation layer is selected from the group consisting of $SiO_2$, $Si_3N_4$ and polyimide.

15. The under bump metallization of claim 12, wherein said at least one passivation layer comprises a plurality of superimposed passivation layers.

16. The under bump metallization of claim 15, wherein at least one of said plurality of passivation layers is selected from the group consisting of $SiO_2$, $Si_3N_4$ and polyimide.

17. The under bump metallization of claim 12, wherein said metal layer is comprised of a plurality of sub-layers of different metallic composition.

18. The under bump metallization of claim 12, wherein said integrated circuitry is in electrical communication with said at least one via through a conductive trace exposed within said at least one via, and said metal layer is in contact with said trace.

19. The under bump metallization of claim 12, wherein said forming said at least one via is effected by etching.

20. The under bump metallization of claim 19, wherein said etching is selected from the group comprising sputter etching and wet etching.

21. The under bump metallization of claim 19, wherein said etching comprises sputter etching effected after application of a resist layer over said at least one passivation layer defining an intended location of said at least one via.

22. The under bump metallization of claim 19, wherein said etching comprises wet etching effected after application of a resist layer over said at least one passivation layer defining an intended location of said at least one via.

23. The under bump metallization of claim 12, further comprising depositing a solder mass over said at least one via.

24. The under bump metallization of claim 13, further comprising liquefying said solder mass and cooling said solder mass to define a solder ball or bump.

25. An under bump metallization formed in at least one via defined in at least one passivation layer over a semiconductor substrate, wherein edges of said under bump metallization are substantially flush with an exposed surface of said passivation layer to define a discrete metal-covered via for connection with external electrical components, fabricated by a method comprising:

providing a semiconductor substrate including integrated circuitry, and said at least one passivation layer having a thickness and disposed over said semiconductor substrate;

providing access to said integrated circuitry for external contact by forming at least one via extending through said at least one passivation layer;

forming a substantially conformal metal layer of a thickness substantially less than the passivation layer thickness over said at least one passivation layer with a portion of said metal layer extending into said at least one via to make electrical contact with said integrated circuitry;

applying an etchant-resistive material over said metal layer and into said at least one via so as to substantially fill said at least one via;

removing a portion of said etchant-resistive material to expose said metal layer only above said at least one passivation layer;

removing said metal layer over said at least one passivation layer except for the portion extending into said at least one via by applying an etchant to said exposed metal layer above said at least one passivation layer while protecting said metal layer portion extending into said at least one via with said etchant-resistive material; and removing said etchant-resistive material within said at least one via.

26. The under bump metallization method of claim 25, wherein said removing said etchant-resistive material over said at least one passivation layer is effected by abrasion.

27. The under bump metallization of claim 26, wherein said abrasion comprises CMP.

28. The under bump metallization of claim 25, wherein said removing said etchant-resistive material and removing said metal layer is effected by completely etching said etchant-resistive material and said underlying metal layer located over said at least one passivation layer, and terminating said etching prior to any substantial etching of said metal layer in said at least one via.

29. The under bump metallization of claim 25, wherein said at least one passivation layer is selected from the group consisting of $SiO_2$, $Si_3N_4$ polymide.

30. The under bump metallization of claim 25, wherein said at least one passivation layer comprises a plurality of superimposed passivation layers.

31. The under bump metallization of claim 30, wherein at least one of said plurality of passivation layers is selected from the group consisting of $SiO_2$, $Si_3N_4$ and polyimide.

32. The under bump metallization of claim 25, wherein said metal layer is comprised of a plurality of sub-layers of different metallic composition.

33. The under bump metallization of claim 25, wherein said integrated circuitry is in electrical communication with said at least one via through a conductive trace exposed within said at least one via, and said metal layer is in contact with said trace.

34. The under bump metallization of claim 25, wherein said forming said at least one via is effected by etching.

35. The under bump metallization of claim 34, wherein said etching is selected from the group comprising sputter etching and wet etching.

36. The under bump metallization of claim 34, wherein said etching comprises sputter etching effected after application of a resist layer over said at least one passivation layer defining an intended location of said at least one via.

37. The under bump metallization of claim 34, wherein said etching comprises wet etching effected after application of a resist layer over said at least one passivation layer defining an intended location of said at least one via.

38. The under bump metallization of claim 25, further comprising depositing a solder mass over said at least one via.

39. The under bump metallization of claim 38, further comprising liquefying said solder mass and cooling said solder mass to define a solder ball or bump.

* * * * *

UNITED STATES PATENT AND TRADEMARK OFFICE
CERTIFICATE OF CORRECTION

PATENT NO : 5,903,058
DATED : May 11, 1999
INVENTOR(S) : Salman Akram

It is certified that error appears in the above-identified patent and that said Letters Patent is hereby corrected as shown below:

On the Title Page:

Under "References Cited," after the list of "Foreign Patent Documents," insert a subheading --Other Documents-- and list thereunder:

--Wolf, S. and R.N. Tauber, Silicon Processing for the VLSI Era-Volume I:Process Technology, Lattice Press, Sunset Beach, CA, pp.529-535 (1986).--

Column 7, line 64, insert a hyphen between "FIGS. 7a" and "7c";

Signed and Sealed this

Thirtieth Day of January, 2001

Attest:

Q. TODD DICKINSON

*Attesting Officer*    *Director of Patents and Trademarks*